(12) United States Patent
Chen et al.

(10) Patent No.: US 8,076,829 B2
(45) Date of Patent: Dec. 13, 2011

(54) ELECTROSTRICTIVE COMPOSITE AND ELECTROSTRICTIVE ELEMENT USING THE SAME

(75) Inventors: Lu-Zhuo Chen, Beijing (CN); Chang-Hong Liu, Beijing (CN); Jia-Ping Wang, Beijing (CN); Shou-Shan Fan, Beijing (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 198 days.

(21) Appl. No.: 12/589,827

(22) Filed: Oct. 29, 2009

(65) Prior Publication Data
US 2011/0012476 A1  Jan. 20, 2011

(30) Foreign Application Priority Data
Jul. 17, 2009  (CN) .......................... 2009 1 0108792

(51) Int. Cl.
*H01L 41/08* (2006.01)
(52) U.S. Cl. ....................................... 310/363; 310/800
(58) Field of Classification Search .................. 310/311, 310/800
See application file for complete search history.

(56) References Cited

U.S. PATENT DOCUMENTS
2010/0143718 A1 * 6/2010 Smalley et al. ............... 428/376

FOREIGN PATENT DOCUMENTS
JP     H05-4312 A       1/1993
KR  10-20080102888     11/2008

OTHER PUBLICATIONS
"Preparation and Application of High Strength Carbon Nanotubes/Polymer Composites", Xue wei et al., Jiangsu Chemical Industry, vol. 35, No. 3, 2007, 1-6.
Carbon Nanotube Actuators, Ray H. Baughman et al., May 21, 1999 vol. 284, Science.

* cited by examiner

Primary Examiner — Mark Budd
(74) Attorney, Agent, or Firm — Altis Law Group, Inc.

(57) ABSTRACT

An electrostrictive composite includes a flexible polymer matrix and a number of one dimensional conductive materials dispersed in the flexible polymer matrix. The flexible polymer matrix is a sheet. The one dimensional conductive materials cooperatively form an electrically conductive structure in the flexible polymer matrix. The one dimensional conductive materials are oriented substantially along a same preferred direction.

21 Claims, 6 Drawing Sheets

ELECTROSTRICTIVE COMPOSITE AND ELECTROSTRICTIVE ELEMENT USING THE SAME

RELATED APPLICATIONS

This application claims all benefits accruing under 35 U.S.C. §119 from China Patent Application No. 200910108792.3, filed on Jul. 17, 2009 in the China Intellectual Property Office. This application is related to U.S. patent application Ser. No. 12/482,040 filed on Jun. 10, 2009 entitled "ELECTROSTRICTIVE COMPOSITE AND METHOD FOR MAKING THE SAME"; and U.S. patent application Ser. No. 12/497,745 filed on Jul. 6, 2009 entitled "ELECTROSTRICTIVE MATERIAL METHOD FOR MAKING THE SAME AND ELECTROTHERMIC TYPE ACTUATOR"; and U.S. patent application Ser. No. 12/482,058 filed on Jan. 16, 2009 entitled "ELECTROSTRICTIVE COMPOSITE AND METHOD FOR MAKING THE SAME".

BACKGROUND

1. Technical Field

This disclosure relates to a carbon nanotube based electrostrictive composite and electrostrictive element using the same.

2. Description of Related Art

Electrostrictive materials are materials that can convert electrical energy, a current or voltage, to mechanical energy, thus imparting a force. Electrostrictive composites have been called artificial muscles due to their similar motion properties.

According to a prior art, a dielectric elastomeric material is provided. The dielectric elastomeric material is usually a poly-acid resin, silicone resin or rubber. This dielectric elastomeric material can provide a higher electrostrictive rate, and has good flexibility, showing characteristics similar to artificial muscles. In practical applications, a dielectric elastomeric film made of the dielectric elastomeric material is set in between two parallel metal electrodes. When a thousand volts DC voltage is applied between the two electrodes, an electrostatic force is generated between the two electrodes in the vertical direction of a surface of the dielectric elastomeric film. The electrostatic force extrudes the dielectric elastomeric film, so that the elastic dielectric film expands in all directions within a plane.

However, the dielectric elastomeric film usually requires a higher DC voltage (thousands of volts) to work, which increases cost of use and limits its application. In addition, the dielectric elastomeric film expands in all directions in a plane, which also limits the applications of the dielectric elastomeric material.

What is needed, therefore, is to provide an electrostrictive composite having a directional expansion and electrostrictive element using the same.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
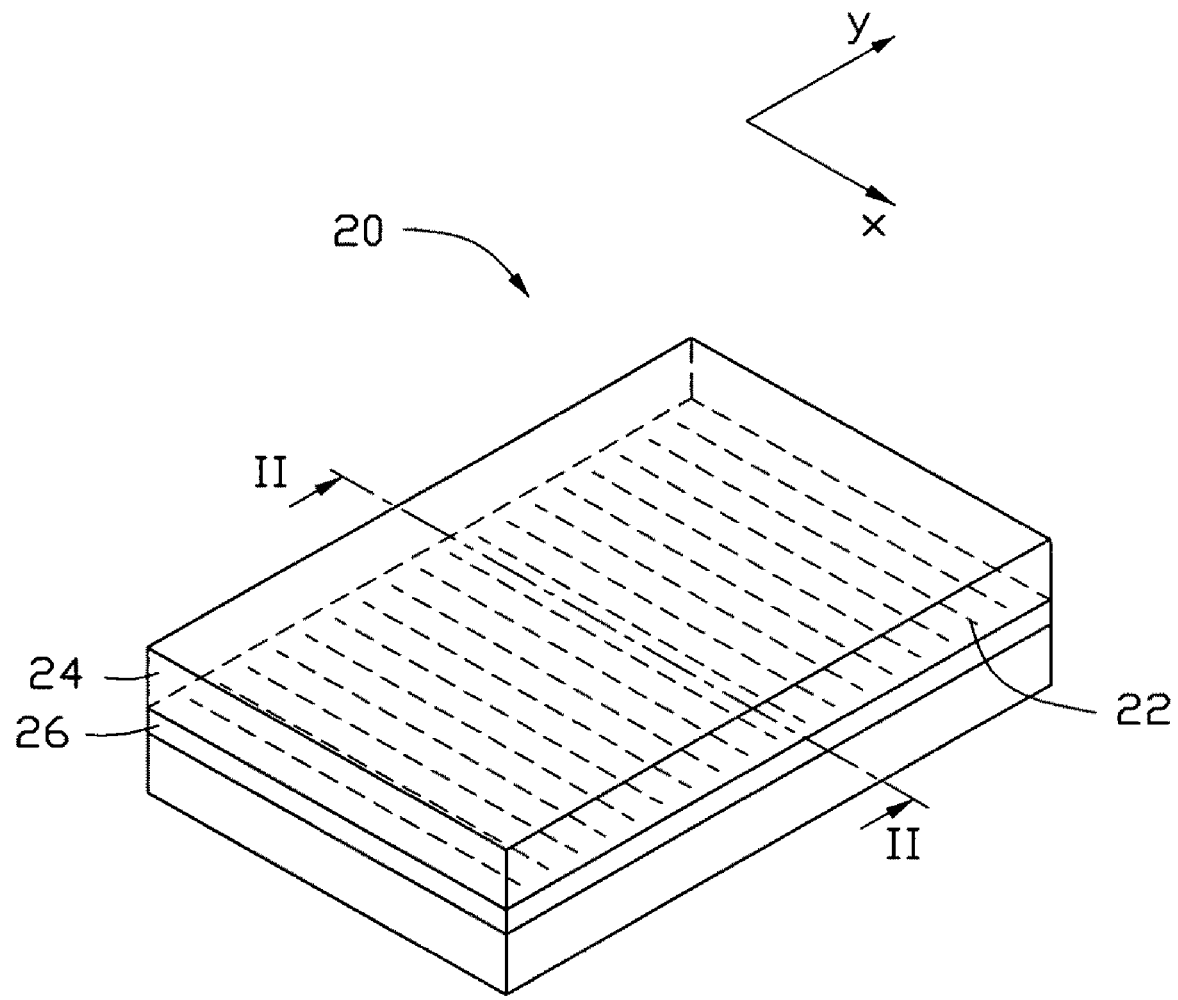
FIG. 1 is a schematic structural view of one embodiment of an electrostrictive composite.
Figure 2:
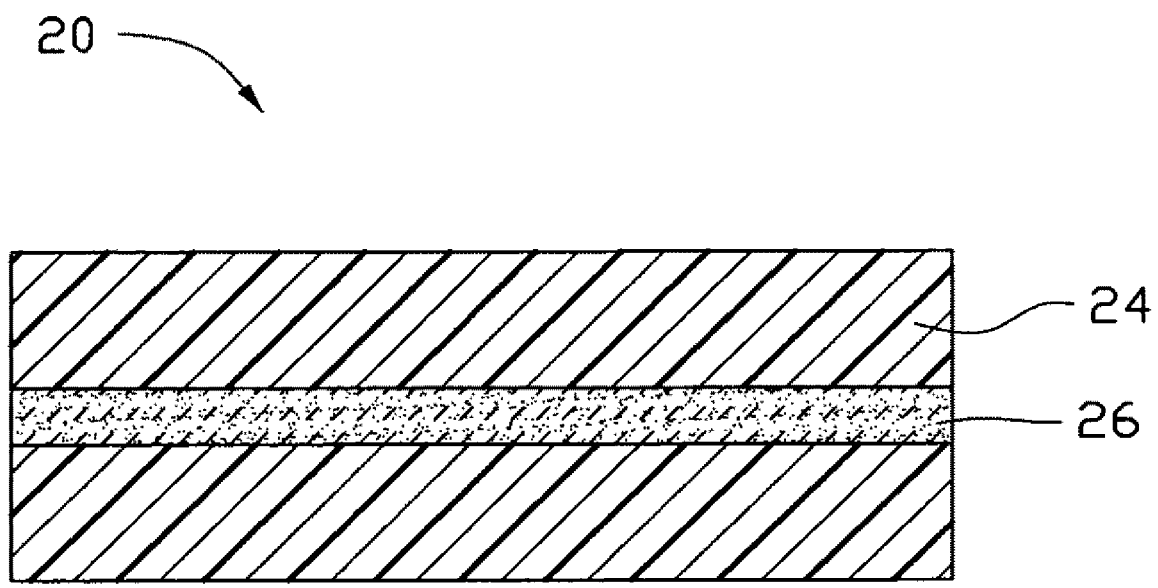
FIG. 2 is a cross-sectional view taken along II-II line of FIG. 1.

Referring to FIG. 1 and FIG. 2, one embodiment of an electrostrictive composite 20 includes a flexible polymer matrix 24 and a plurality of one dimension conductive materials 22. The electrostrictive composite 20 is a sheet material. The one dimension conductive materials 22 are arranged to form an electrically conductive structure 26 dispersed in the flexible polymer matrix 24, thus the electrostrictive composite 20 is electrically conductive. Each of the one dimension conductive materials 22 has a long axis (along X direction shown in FIG. 1) and a short axis (along Y direction shown in FIG. 1). The long axis extends along the length direction of the one dimension conductive materials 22. The long axes of the one dimension conductive materials 22 are oriented substantially along a preferred orientation in a same plane. The short axis extends along a direction substantially perpendicular to the long axis, along a radial direction of the one dimension conductive materials 22.

The flexible polymer matrix 24 is a sheet material. A material of the flexible polymer matrix 24 can be silicone elastomer, poly methyl methacrylate, polyurethane, epoxy resin, polypropylene acid ethyl ester, acrylic acid ester, polystyrene, polybutadiene, polyacrylonitrile, polyaniline, polypyrrole, polythiophene and combinations thereof. In one embodiment, the flexible polymer matrix 24 is silicone elastomer.

The one dimension conductive materials 22 have a one dimensional structure. The one dimension conductive materials 22 have a large length-diameter ratio and good conductivity. The one dimension conductive materials 22 can be carbon fibers, metal nanowires, carbon nanotubes, or carbon nanotube yarns. A weight percentage of the one dimension conductive materials 22 in the electrostrictive composite 20 can range from about 0.1% to about 50%.

In one embodiment, the one dimension conductive materials 22 are carbon nanotubes. The electrically conductive structure 26 is a carbon nanotube film structure formed by the carbon nanotubes. A weight percentage of the carbon nanotubes in the electrostrictive composite 20 may range from about 0.1% to about 3%. Each of the carbon nanotubes has a long axis and a short axis. The short axis extends along a radial direction of the carbon nanotube. The long axis extends along a direction of the length direction of the carbon nanotube. The long axes of the carbon nanotubes are oriented substantially along a same preferred orientation (X direction) in the flexible polymer matrix 24. The carbon nanotubes are assembled together by Van der Waals attractive force to form the carbon nanotube film structure. The carbon nanotube film structure has a substantially sheet-like structure and is dispersed in the flexible polymer matrix 24. The carbon nanotube film structure has a free-standing structure. The term "free-standing" means that the carbon nanotube film structure does not have to be supported by a substrate and can sustain the weight of it when it is hoisted by a portion thereof without tearing or falling apart. A thickness of the carbon nanotube film structure may range from about 0.5 nanometers to about 1 millimeter.

Figure 3:
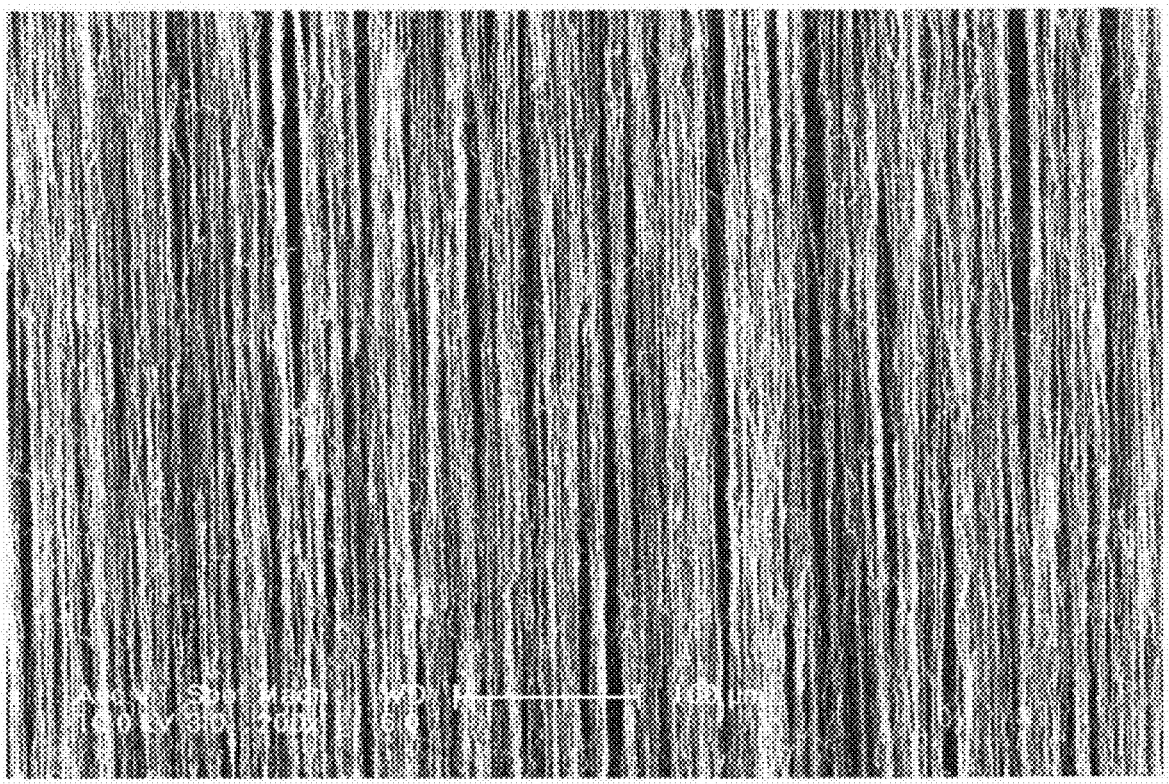
FIG. 3 is a Scanning Electron Microscope image of a drawn carbon nanotube film which can be used in the electrostrictive composite of FIG. 1.

In one embodiment, the carbon nanotube film structure includes at least one carbon nanotube film. Referring to FIG. 3, the carbon nanotubes in the carbon nanotube film are successively oriented and joined end to end by Van der Waals attractive force. The long axes of the carbon nanotubes in the carbon nanotube film are also oriented along a same preferred orientation (X direction). When the carbon nanotube film structure includes a plurality of carbon nanotube films, the carbon nanotube film can be stacked or located in parallel. The carbon nanotubes in different carbon nanotube films are oriented substantially along the same preferred orientation.

The carbon nanotubes can be single-walled carbon nanotubes, double-walled carbon nanotubes, multi-walled carbon nanotubes, or combinations thereof. A length of the carbon nanotubes can range from about 50 micrometers to about 900 micrometers in one embodiment. The carbon nanotubes are flexible and have excellent electricity to heat conversion efficiency. The carbon nanotubes are in contact with each other to form the carbon nanotube film structure in the flexible polymer matrix 24. While a voltage is applied to the electrostrictive composite 20, the carbon nanotube film structure will rapidly heat and expand the flexible polymer matrix 22.

The work principle of the electrostrictive composite 20 is described as follows. When a voltage is applied to the electrostrictive composite 20 along a direction substantially perpendicular to the long axes of the one dimensional conductive materials 22, a current flowing through the electrically conductive structure 26 extends along a direction substantially perpendicular to the long axes of the one dimensional conductive materials 22. The electrical energies absorbed by the one dimensional conductive materials 22 results in local thermal confinement, which breaks the thermodynamic equilibrium therearound. The current and temperature increase simultaneously and rapidly until another thermodynamic equilibrium is achieved. The temperature of the one dimensional conductive materials 22 rises by absorbing electrical energy, resulting in a temperature increase of the flexible polymer matrix 24 due to the high thermal conductance of the one dimensional conductive materials 22. This can lead to an expansion of the electrostrictive composite 20 along the direction substantially perpendicular to the long axes of the one dimensional conductive materials 22.

The long axes of the one dimensional conductive materials 22 extends along a substantially same direction (X direction) in the flexible polymer matrix 24. The thermal expansion coefficients along the X direction of the electrostrictive composite 20 is smaller than the thermal expansion coefficients along the Y direction. Thus the electrostrictive composite 20 has an anisotropic thermal expansion coefficients. When a voltage is applied along the Y direction, the electrostrictive composite 20 only expands along the Y direction. The electrostrictive composite 20 has a directional expansion and can be used in the special fields.

In one embodiment, a carbon nanotube film structure including about 200 layers of carbon nanotube films is stacked in the silicon elastomer to form the electrostrictive composite 20. The carbon nanotubes in different carbon nanotube films are oriented substantially along the same preferred orientation. The weight percentage of the carbon nanotubes in the electrostrictive composite 20 is about 2%. In this embodiment, the electrostrictive composite 20 only requires a relatively low voltage of about 25 volts to work.

Figure 4:
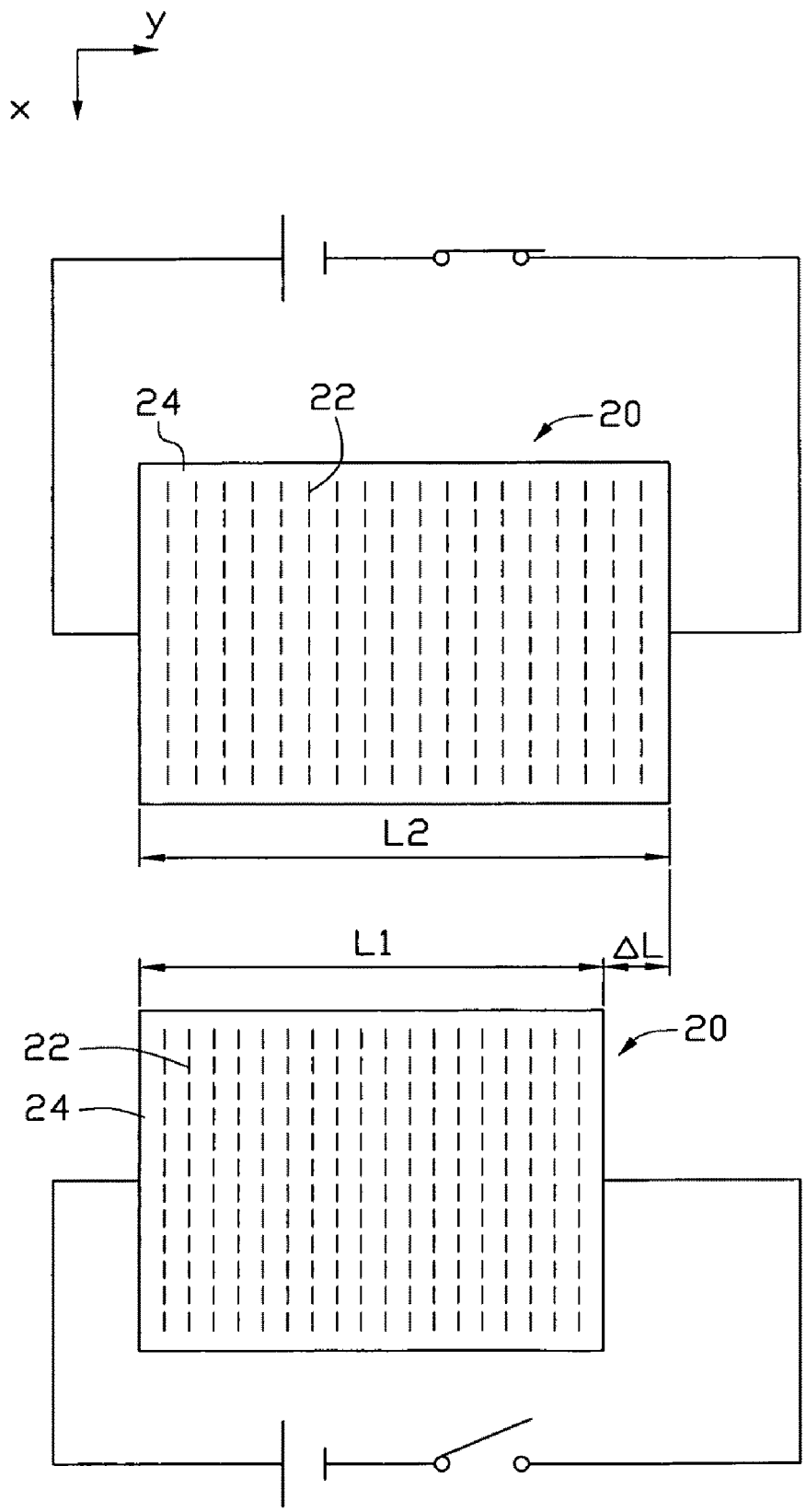
FIG. 4 is a schematic view of the electrostrictive composite of FIG. 1 before and after expansion.

Referring to FIG. 4, the thermal expansion coefficient of the electrostrictive composite 20 is tested. In the tested embodiment, the flexible polymer matrix 24 is silicone elastomer comprising 98 wt % of the electrostrictive composite 20, and the one dimension conductive materials 22 are multi-walled carbon nanotube comprising 2 wt % of the electrostrictive composite 20. The electrically conductive structure 26 is a carbon nanotube film structure including about 200 layers of carbon nanotube films. The thermal expansion coefficient a of the electrostrictive composite 20 is calculated according to following formula:

$$\alpha = \frac{L2 - L1}{L1} \times \frac{1}{\Delta T} = \frac{\varepsilon}{\Delta T}$$

wherein L1 is the original length of the electrostrictive composite 20, L2 is the length of the electrostrictive composite 20 after expansion, $\Delta T$ is the increase of the temperature of the electrostrictive composite 20, and δ is the strain. In the tested embodiment, the L1 is about 4 millimeters. The L2 increases to about 4.1025 millimeters after a voltage of about 25 Volts is supplied for about 2 minutes. The increase of the length $\Delta L$ is about 0.1025 millimeters. The increase of the temperature $\Delta T$ is about 150 Kelvin. The strain ε of the electrostrictive composite 20 is calculated to be about 2%. The expansion coefficient α of the electrostrictive composite 20 is calculated to be about $1.33 \times 10^{-4} K^{-1}$.

The carbon nanotube film structure used in the above embodiments can be provided by the following steps:

(a) providing a super-aligned carbon nanotube array;

(b) selecting one or more carbon nanotubes having a predetermined width from the super-aligned carbon nanotube array;

(c) pulling out the carbon nanotubes from the super-aligned carbon nanotube array to form carbon nanotube segments that are joined end to end at a uniform speed to achieve a uniform carbon nanotube film; and (d) providing a frame and stacking at least two carbon nanotube films on the frame to form the above described carbon nanotube film structure.

In step (a), the super-aligned carbon nanotube array can be formed by:

(a1) providing a substantially flat and smooth substrate;

(a2) forming a catalyst layer on the substrate;

(a3) annealing the substrate with the catalyst layer in air at a temperature from about 700° C. to about 900° C. for about 30 to about 90 minutes;

(a4) heating the substrate with the catalyst layer to a temperature from about 500° C. to about 740° C. in a furnace with a protective gas therein; and (a5) supplying a carbon source gas to the furnace for about 5 minutes to about 30 minutes and growing the super-aligned carbon nanotube array on the substrate.

In step (a1), the substrate can be a P-type silicon wafer, an N-type silicon wafer, or a silicon wafer with a film of silicon dioxide thereon. Here, a 4-inch P-type silicon wafer is used as the substrate.

In step (a2), the catalyst can be iron (Fe), cobalt (Co), nickel (Ni), or any alloy thereof.

In step (a4), the protective gas can be at least one of the following: nitrogen ($N_2$), ammonia ($NH_3$), and a noble gas. In step (a5), the carbon source gas can be a hydrocarbon gas, such as ethylene ($C_2H_4$), methane ($CH_4$), acetylene ($C_2H_2$), ethane ($C_2H_6$), or any combination thereof.

The super-aligned carbon nanotube array can be about 200 microns to about 400 microns in height, and includes a plurality of substantially parallel carbon nanotubes approximately perpendicular to the substrate. The carbon nanotubes in the super-aligned carbon nanotube array can be single-walled carbon nanotubes, double-walled carbon nanotubes, or multi-walled carbon nanotubes. Diameters of the single-walled carbon nanotubes are from about 0.5 nanometers to about 10 nanometers, diameters of the double-walled carbon nanotubes are from about 1 nanometer to about 50 nanometers, and diameters of the multi-walled carbon nanotubes are from about 1.5 nanometers to about 50 nanometers.

The super-aligned carbon nanotube array formed under such conditions are essentially free of impurities such as carbonaceous or residual catalyst particles. The carbon nanotubes in the super-aligned array are closely packed together by Van der Waals attractive force.

In step (b), the carbon nanotubes having a predetermined width can be selected by using an adhesive tape as the tool to contact the super-aligned carbon nanotube array. Each carbon nanotube segment includes a plurality of substantially parallel carbon nanotubes. In step (c), the pulling direction is substantially perpendicular to the growing direction of the super-aligned carbon nanotube array.

Specifically, during the pulling process, as the initial carbon nanotube segment is drawn out, other carbon nanotube segments are also drawn out end-to-end due to the Van der Waals attractive force between ends of adjacent segments. This process of drawing ensures that a continuous, uniform carbon nanotube film having a certain width can be formed. The carbon nanotube film includes a plurality of carbon nanotubes joined end-to-end. The carbon nanotubes in the carbon nanotube film are all substantially parallel to the pulling/drawing direction, and the carbon nanotube film produced in such manner can be selectively formed to have a predetermined width. The carbon nanotube film formed by the pulling/drawing method has superior uniformity of thickness and conductivity over a typical carbon nanotube film in which the carbon nanotubes are disorganized and not arranged along any particular axis. Furthermore, the pulling/drawing method is simple and fast, thereby making it suitable for industrial applications.

The maximum width possible for the carbon nanotube film depends on the size of the carbon nanotube array. The length of the carbon nanotube film can be arbitrarily set, as desired. When the substrate is a 4-inch P-type silicon wafer, the width of the carbon nanotube film can range from about 0.01 centimeters to about 10 centimeters, and the thickness of the carbon nanotube film is in a range from about 0.5 nanometers to about 100 microns.

In step (d), it is noted that because the carbon nanotubes in the super-aligned carbon nanotube array have a high purity and a high specific surface area, the carbon nanotube film is adherent in nature. As a result, at least one carbon nanotube film can be directly adhered to the frame, thus forming one carbon nanotube film structure on the frame, thereby creating one carbon nanotube film structure.

For example, two or more such carbon nanotube films can be stacked on one another on the frame to form a carbon nanotube film structure with stacked carbon nanotube films. The angle between the alignment axes of the carbon nanotubes in each two adjacent carbon nanotube films is about 0 degrees. The carbon nanotubes of the carbon nanotube film structure are aligned substantially along a same direction.

Figure 5:
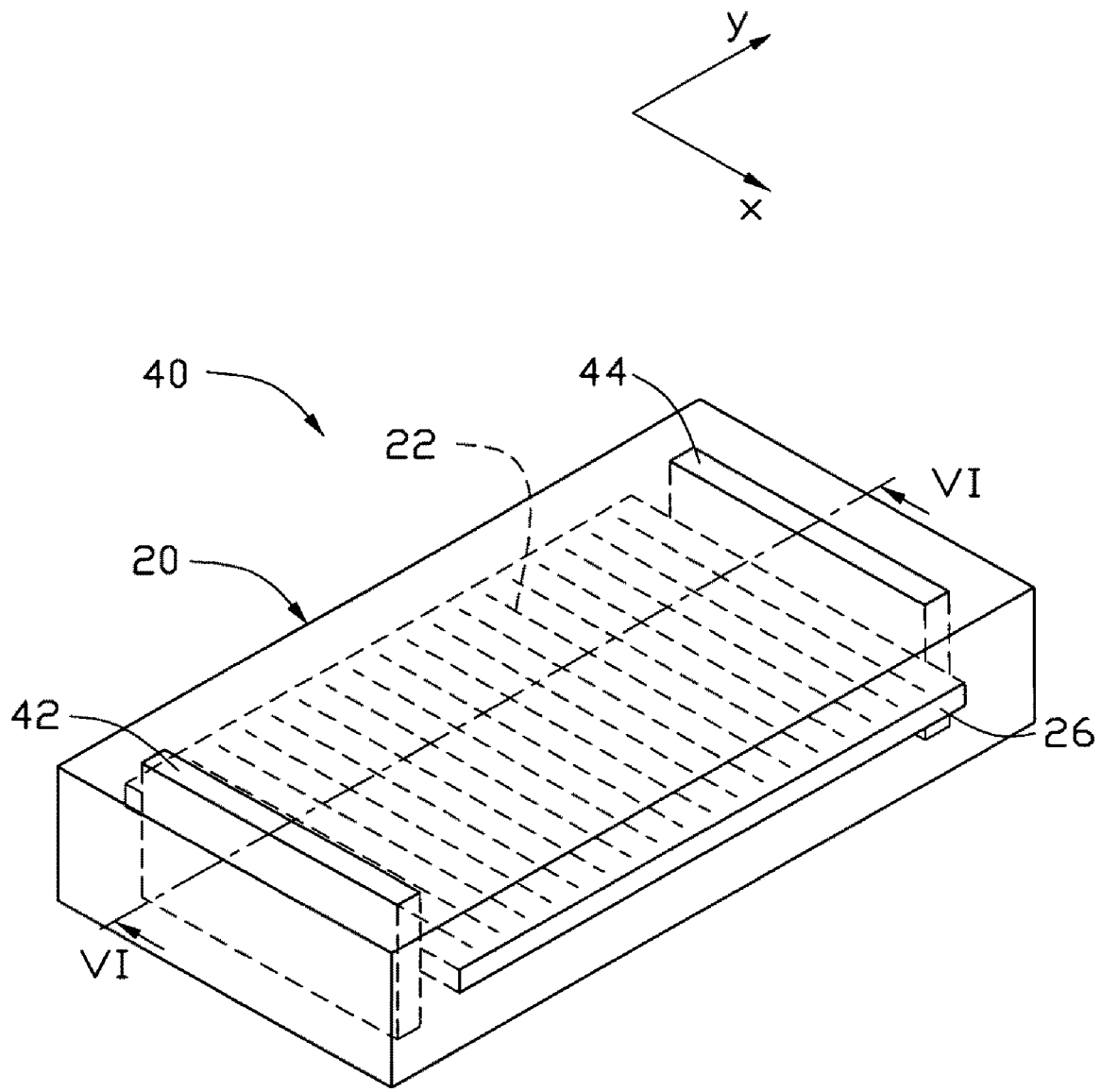
FIG. 5 is a schematic structural view of an electrostrictive element.
Figure 6:
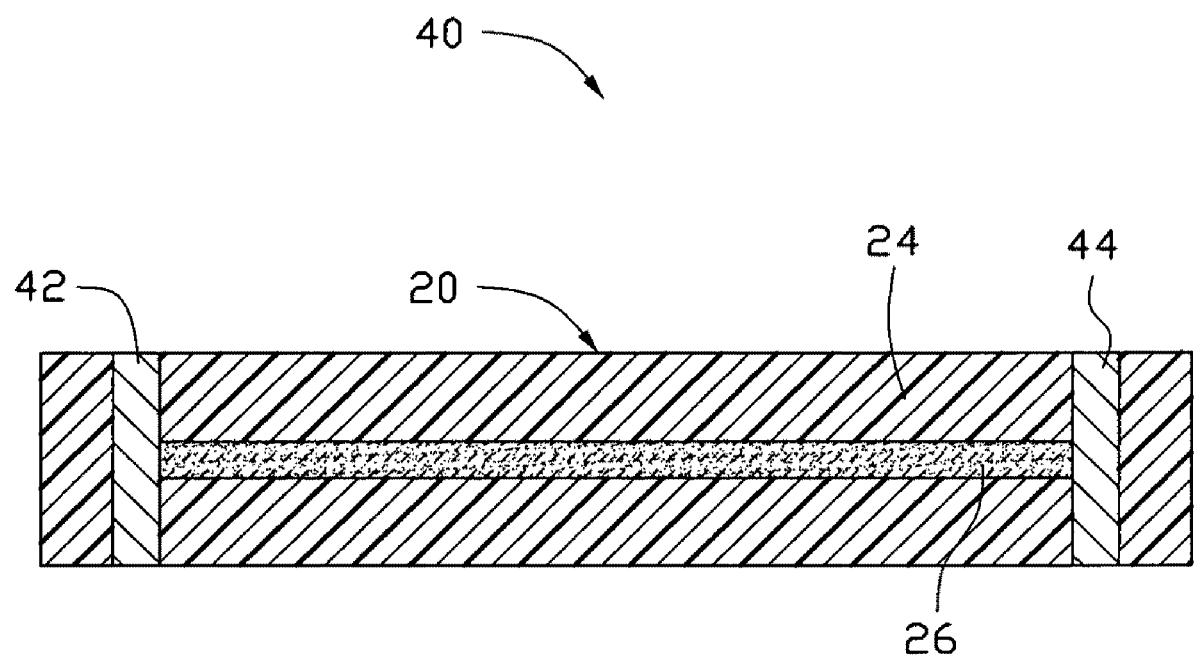
FIG. 6 is a cross-sectional view taken along VI-VI line of FIG. 5.

Referring to FIG. 5 and FIG. 6, an electrostrictive element 40 using the electrostrictive composite 20 includes a first electrode 42 and a second electrode 44. The first electrode 42 and the second electrode 44 are located apart from each other, and are electrically connected to the electrostrictive composite 20.

The first electrode 42 and the second electrode 44 can be lamellar metal sheets. The first electrode 42 and the second electrode 44 can be located at two opposite ends of the electrostrictive composite 20 and electrically connected to the electrostrictive composite 20. The first electrode 42 and the second electrode 44 can also be dispersed in the electrostrictive composite 20. The setting of the electrode 42 and the second electrode 44 can be satisfied in a condition that a current flowing through the electrically conductive structure 26 is along a direction substantially perpendicular to the long axes of the one dimensional conductive materials 22. In this embodiment, the first electrode 42 and the second electrode 42 are copper sheets. The copper sheets are located at two opposite ends of the electrostrictive composite 20 and electrically connected to the electrostrictive composite 20.

Finally, it is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. An electrostrictive composite comprising:
   a flexible polymer matrix in a sheet structure form; and
   a plurality of one dimensional conductive materials dispersed in the flexible polymer matrix, the one dimensional conductive materials-cooperatively forming an electrically conductive structure in the flexible polymer matrix, wherein the one dimensional conductive materials are carbon nanotubes oriented substantially along a preferred orientation and joined end to end by van der Waals attractive force.

2. The electrostrictive composite of claim 1, wherein each of the carbon nanotubes has a long axis and a short axis, the long axis extends along a length direction of the carbon nanotubes, the short axis extends along a radial direction, of the carbon nanotubes.

3. The electrostrictive composite of claim 2, wherein the long axes of the carbon nanotubes are oriented substantially along the preferred orientation.

4. The electrostrictive composite of claim 1, wherein when a current flowing through the electrically conductive structure is substantially perpendicular to an alignment direction of the carbon nanotubes, the electrostrictive composite expands along a direction substantially perpendicular to the preferred orientation of the carbon nanotubes.

5. The electrostrictive composite of claim 1, wherein a material of the flexible polymer matrix is silicone elastomer, poly methyl methacrylate, polyurethane, epoxy resin, polypropylene acid ethyl ester, acrylic acid ester, polystyrene, polybutadiene, polyacrylonitrile, polyaniline, polypyrrole, polythiophene, or combinations thereof.

6. An electrostrictive composite comprising:
   a flexible polymer matrix having a sheet structure; and
   a carbon nanotube film structure dispersed in the flexible polymer matrix, the carbon nanotube film structure comprising at least one carbon nanotube film, the at least one carbon nanotube film comprising a plurality of carbon nanotubes;
   wherein the carbon nanotubes in the at least one carbon nanotube film are successively oriented substantially along a preferred orientation and joined end to end by van der Waals attractive force.

7. The electrostrictive composite of claim 6, wherein the carbon nanotubes are assembled together by Van der Waals attractive force to form the carbon nanotube film structure.

8. The electrostrictive composite of claim 6, wherein the carbon nanotube film structure comprises a plurality of carbon nanotube films, the carbon nanotubes in each of the carbon nanotube films are oriented substantially along a same preferred orientation.

9. The electrostrictive composite of claim 6, wherein a weight percentage of the carbon nanotubes in the electrostrictive composite is in a range from about 0.1% to about 3%.

10. The electrostrictive composite of claim 6, wherein each of the carbon nanotubes has a long axis and a short axis, the long axis extends along a length direction of the carbon nanotubes, the short axis extends along a radial direction of the carbon nanotubes, the long axes of the carbon nanotubes are oriented substantially along the preferred orientation.

11. The electrostrictive composite of claim 6, wherein when a current flowing through the carbon nanotube film structure is substantially perpendicular to the preferred orientation of the carbon nanotubes, the electrostrictive composite expands along a direction substantially perpendicular to the preferred orientation of the carbon nanotubes.

12. An electrostrictive element comprising:
a flexible polymer matrix in a sheet structure form;
a carbon nanotube film structure dispersed in the polymer matrix, the carbon nanotube film structure comprising at least one carbon nanotube film, the at least one carbon nanotube film comprising a plurality of carbon nanotubes, wherein the carbon nanotubes in the at least one carbon nanotube film are oriented substantially along a first direction, the carbon nanotube film structure having a first thermal expansion coefficient along the first direction and a second thermal expansion coefficient along a second direction substantially perpendicular to the first direction, the first thermal expansion coefficient is smaller than the second thermal expansion coefficients; and
a first electrode and a second electrode located apart from each other and electrically connected to the carbon nanotube film structure;
wherein the electrostrictive element is controlled to expand or contract in the second direction by controlled heating of the carbon nanotube film structure to cause the flexible polymer matrix to expand or contract in the second direction via adjustment of a voltage applied between the first electrode and the second electrode.

13. The electrostrictive element of claim 12, wherein the first electrode and the second electrode are located at opposite ends of the flexible polymer.

14. The electrostrictive element of claim 13, wherein the first electrode and the second electrode is dispersed in the flexible polymer.

15. The electrostrictive element of claim 13, wherein an arrangement of the first electrode and the second electrode is such that a current flowing through the carbon nanotube film structure is along a direction substantially perpendicular to the first direction.

16. The electrostrictive element of claim 12, wherein the carbon nanotubes in the at least one carbon nanotube film are joined end to end by Van der Waals attractive force.

17. The electrostrictive element of claim 12, wherein a weight percentage of the carbon nanotubes in the electrostrictive element is in a range from about 0.1% to about 3%.

18. The electrostrictive element of claim 12, wherein a material of the flexible polymer matrix is silicone elastomer, poly methyl methacrylate, polyurethane, epoxy resin, polypropylene acid ethyl ester, acrylic acid ester, polystyrene, polybutadiene, polyacrylonitrile, polyaniline, polypyrrole, polythiophene, or combinations thereof.

19. The electrostrictive composite of claim 1, wherein a weight percentage of the carbon nanotubes in the electrostrictive composite is in a range from about 0.1% to about 3%.

20. The electrostrictive composite of claim 6, wherein a material of the flexible polymer matrix is silicone elastomer, poly methyl methacrylate, polyurethane, epoxy resin, polypropylene acid ethyl ester, acrylic acid ester, polystyrene, polybutadiene, polyacrylonitrile, polyaniline, polypyrrole, polythiophene, or combinations thereof.

21. The electrostrictive composite of claim 6, wherein the carbon nanotube film structure has a free-standing structure.

* * * * *